United States Patent
Kamins et al.

(10) Patent No.: US 8,043,687 B2
(45) Date of Patent: Oct. 25, 2011

(54) STRUCTURE INCLUDING A GRAPHENE LAYER AND METHOD FOR FORMING THE SAME

(75) Inventors: Theodore I. Kamins, Palo Alto, CA (US); R. Stanley Williams, Portola Valley, CA (US); Nathaniel Quitoriano, Pacifica, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 326 days.

(21) Appl. No.: 12/253,158

(22) Filed: Oct. 16, 2008

(65) Prior Publication Data
US 2010/0003462 A1    Jan. 7, 2010

Related U.S. Application Data

(60) Provisional application No. 61/077,865, filed on Jul. 2, 2008.

(51) Int. Cl.
*B32B 9/00*       (2006.01)
*B32B 19/00*      (2006.01)
*C30B 23/00*      (2006.01)
*C30B 25/00*      (2006.01)
*C30B 28/12*      (2006.01)
*C30B 28/14*      (2006.01)

(52) U.S. Cl. ........ 428/172; 428/408; 428/688; 428/689; 428/699; 428/700; 428/701; 428/702; 117/84; 117/88; 117/89; 117/95; 117/97; 117/105; 117/106; 117/107; 117/929

(58) Field of Classification Search ............ 428/172, 428/408, 688, 689, 697, 699, 700, 701, 702; 117/84, 88, 89, 95, 97, 105, 106, 107, 929; 438/478, 479, 480, 481; 257/E21.09, E21.094, 257/E21.099, E21.101, E21.102, E21.104
See application file for complete search history.

(56) References Cited

U.S. PATENT DOCUMENTS
7,732,859 B2 *  6/2010  Anderson et al. ............. 257/328
* cited by examiner

*Primary Examiner* — Catherine A Simone

(57) ABSTRACT

A method for forming a graphene layer is disclosed herein. The method includes establishing an insulating layer on a substrate such that at least one seed region, which exposes a surface of the substrate, is formed. A seed material in the seed region is exposed to a carbon-containing precursor gas, thereby initiating nucleation of the graphene layer on the seed material and enabling lateral growth of the graphene layer along at least a portion of a surface of the insulating layer.

21 Claims, 3 Drawing Sheets

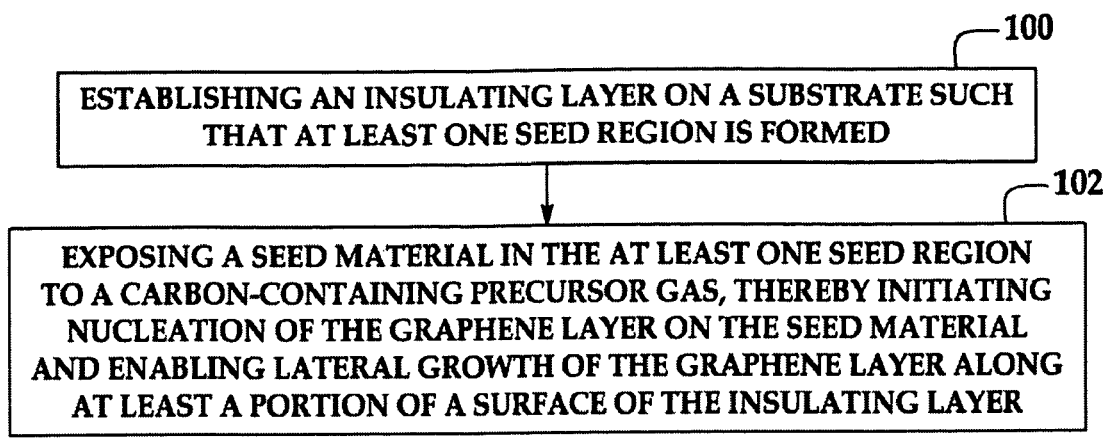
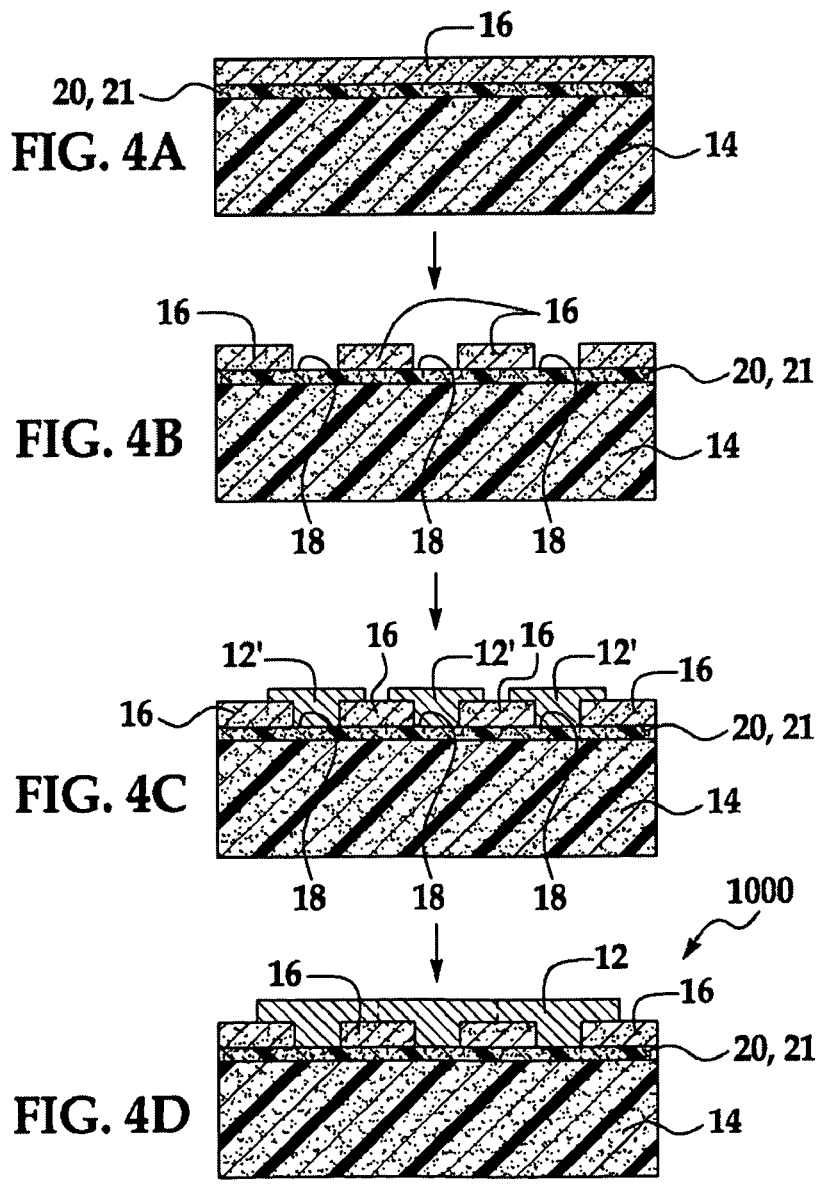

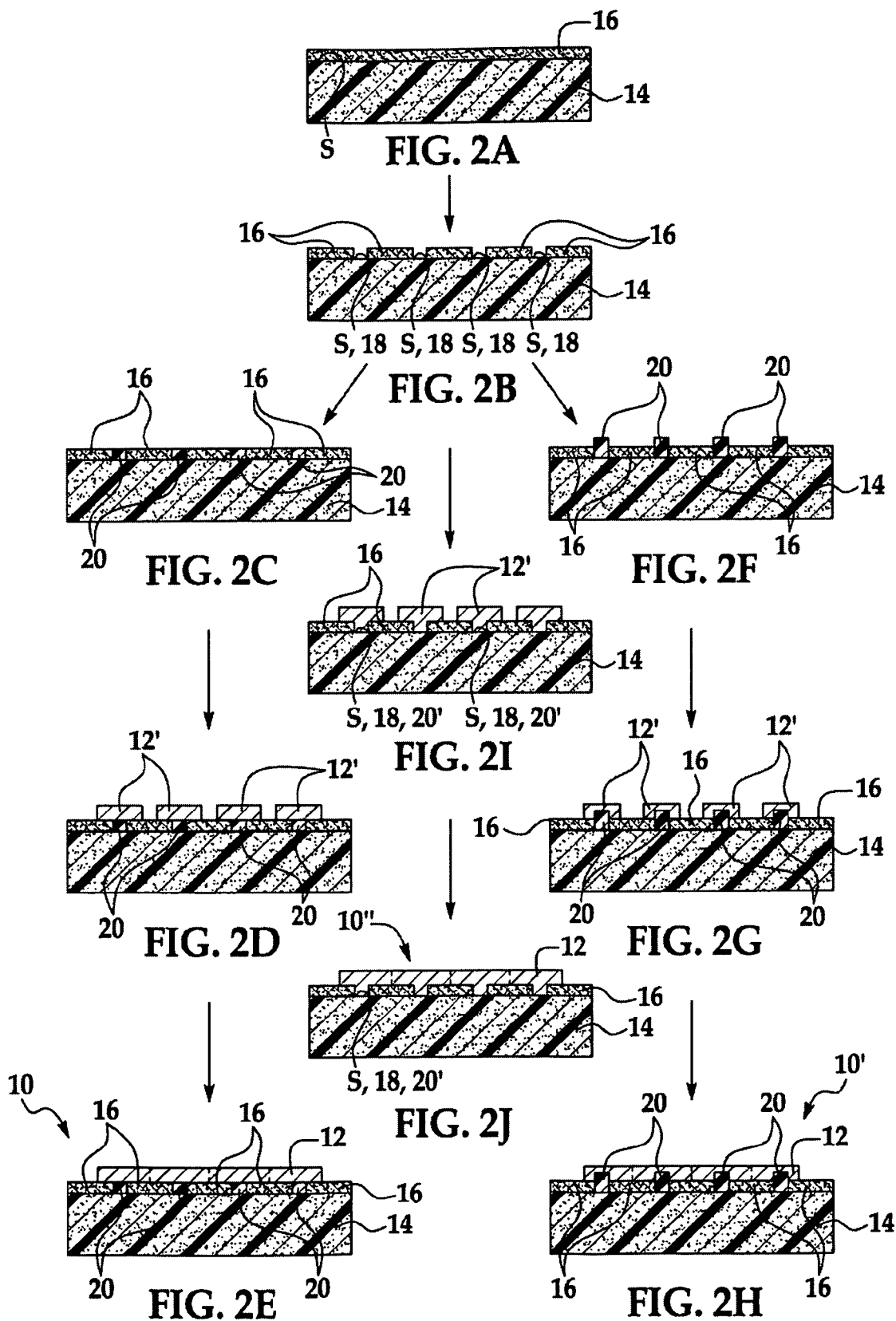

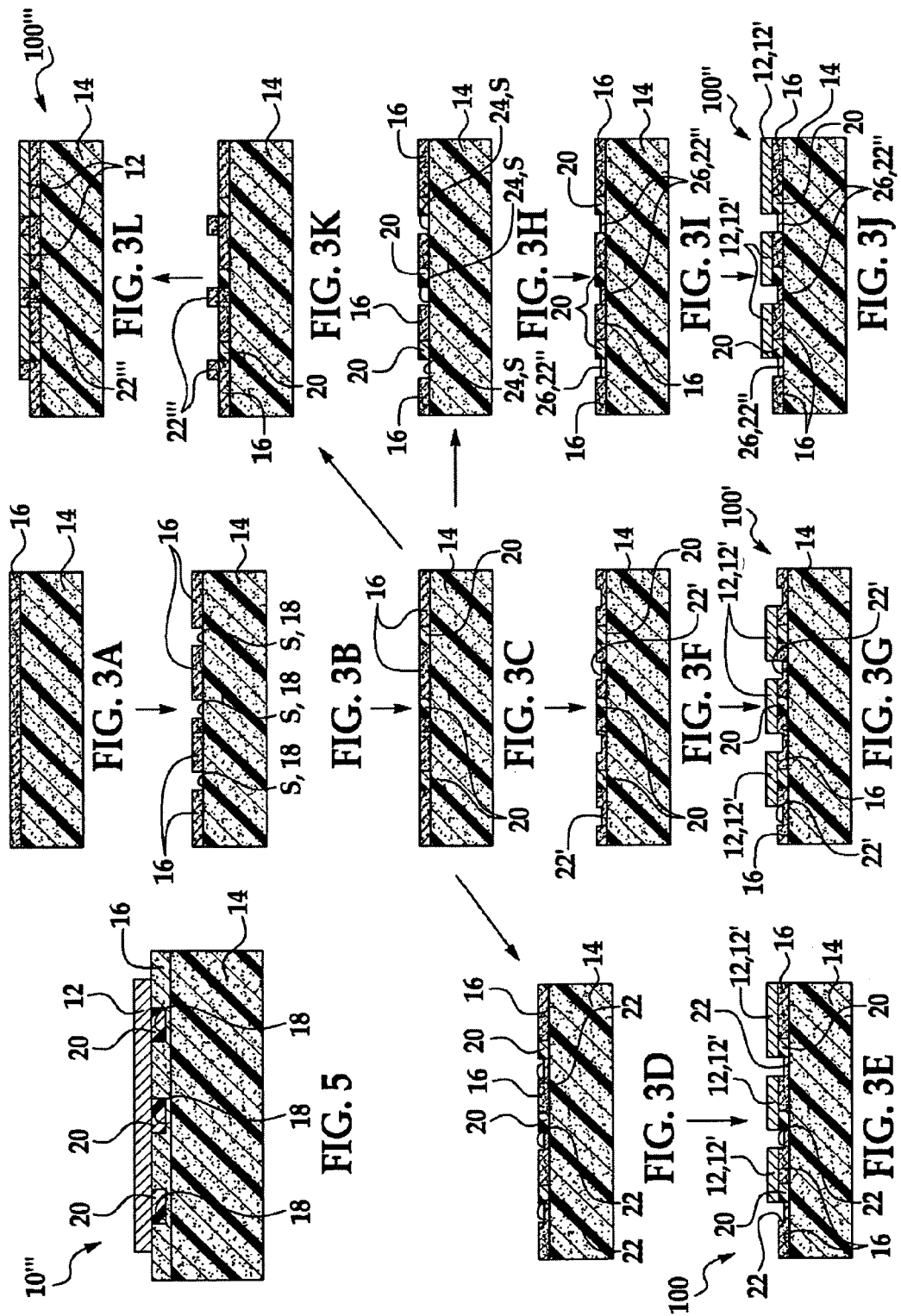

STRUCTURE INCLUDING A GRAPHENE LAYER AND METHOD FOR FORMING THE SAME

CROSS-REFERENCE TO RELATED APPLICATION

The present application claims priority from provisional application Ser. No. 61/077,865, filed Jul. 2, 2008, the contents of which are incorporated herein by reference in their entirety.

BACKGROUND

The present disclosure relates generally to a structure including a graphene layer and a method for forming a graphene layer.

Graphene is the basic structural element of other graphitic materials including graphite, fullerenes, and carbon nanotubes. Graphene is formed of $sp^2$-bonded carbon atoms that are densely packed in a honeycomb crystal lattice. Generally, graphene is in the form of one-atom-thick planar sheets. Several different approaches have been proposed to form single or multiple layers of graphene. For example, exfoliation methods have been used to form small areas of single or multiple layers of graphene. Such methods, however, generally do not enable control over the size of the crystal formed or the location of single layers. Similarly, the transfer of graphene from a large piece to a substrate by rubbing is generally not amenable to forming large, controllable regions of graphene.

BRIEF DESCRIPTION OF THE DRAWINGS

Features and advantages of embodiments of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIG. 1 is a flow diagram illustrating an embodiment of the method for forming a graphene layer;

FIGS. 2A-2E are schematic cross-sectional views which together illustrate the formation of an embodiment of a structure including a graphene layer;

FIGS. 2A, 2B and 2F-2H are schematic cross-sectional views which together illustrate the formation of another embodiment of a structure including a graphene layer;

FIGS. 2A, 2B and 2I-2J are schematic cross-sectional views which together illustrate the formation of still another embodiment of a structure including a graphene layer;

FIGS. 3A-3E are schematic cross-sectional views which together illustrate the formation of another embodiment of a structure including graphene layers and growth limiting features;

FIGS. 3A-3C, 3F and 3G are schematic cross-sectional views which together illustrate the formation of still another embodiment of a structure including graphene layers and growth limiting features;

FIGS. 3A-3C and 3H-3J are schematic cross-sectional views which together illustrate the formation of yet another embodiment of a structure including graphene layers and growth limiting features;

FIGS. 3A-3C and 3K-3L are schematic cross-sectional views which together illustrate the formation of yet another embodiment of a structure including graphene layers and growth limiting features;

FIGS. 4A-4D are schematic cross-sectional views which together illustrate still another embodiment of the formation of still another embodiment of a structure including a graphene layer; and FIG. 5 is a schematic cross-sectional view of another embodiment of a structure including a graphene layer.

DETAILED DESCRIPTION

Embodiments of the method disclosed herein advantageously enable growth of graphene layer(s) over relatively large areas/sections/portions using epitaxial growth techniques. It is believed that the method(s) disclosed herein utilize a chemical vapor deposition technique that relies on the crystalline anisotropy that is inherent in the graphene structure.

Referring now to FIG. 1, an embodiment of the method for forming a graphene layer is depicted. The method generally includes establishing an insulating layer on a substrate such that at least one seed region, which exposes a surface of the substrate, is formed, as shown at reference numeral 100; and exposing a seed material in the at least one seed region to a carbon-containing precursor gas, thereby initiating nucleation of the graphene layer on the seed material and enabling lateral growth of the graphene layer along at least a portion of a surface of the insulating layer, as shown at reference numeral 102. It is to be understood that embodiments of the method will be further discussed in reference to the remaining Figures.

Referring now to FIGS. 2A through 2J, three embodiments of a method for forming different embodiments of a structure 10, 10', 10" (respectively shown in FIGS. 2E, 2H and 2J) including a graphene layer 12 are depicted. One embodiment of the method is shown in FIGS. 2A through 2E, another embodiment of the method is shown in FIGS. 2A, 2B, and 2F-2H, and still another embodiment of the method is shown in FIGS. 2A, 2B, and 2I-2J.

FIG. 2A illustrates the substrate 14 having an insulating layer 16 established thereon. The substrate 14 may be a base substrate wafer formed of single-crystal Si, single crystal $Al_2O_3$ (i.e., sapphire), SiC, GaAs, InP, GaP, Ge, or InAs. In some instances, the base substrate wafer has a diameter ranging from about 25 mm to about 300 mm. Generally, silicon wafers have larger diameters than other materials. It is to be understood that the range of substrate 14 sizes may depend, at least in part, on the material of the base substrate wafer which forms all or a portion of the substrate 14. In some instances, the substrate 14 includes the base substrate wafer and other layers, such as layers containing electronic circuitry or electrical isolation regions or additional semiconductor layers. In some instances, the substrates 14 have a relatively large area/section/portion that the subsequently formed graphene layer 12 partially or entirely covers. It is to be understood that other suitable substrates may also be used.

As shown in FIGS. 2A and 2B, in an embodiment, the insulating layer 16 is established on the entire surface S of the substrate 14, and is then patterned to expose portion(s) of the substrate surface S and form seed region(s) 18. The material used to form the insulating layer 16 may be thermally grown on the substrate surface S, or it may be deposited thereon using, for example, low-pressure chemical vapor deposition (LPCVD), reduced-pressure chemical vapor deposition (RPCVD), plasma enhanced chemical vapor deposition (PECVD), atmospheric pressure chemical vapor deposition (APCVD), or any other suitable chemical or physical vapor deposition techniques. In some instances, thermally grown $SiO_2$ may be desirable, at least in part because of the quality and reproducibility of such layers formed by thermal oxidation.

Patterning may be accomplished using photolithography, e-beam lithography, imprint lithography, or other similar methods to pattern seed regions 18 into the insulating layer 16. As previously mentioned and as shown in FIG. 2B, patterning is accomplished through the thickness of the insulating layer 16 such that one or more portions of the substrate surface S are exposed. These exposed portion(s) are the seed regions 18. While four seed regions 18 are shown in FIG. 2B, it is to be understood that more or fewer seed regions 18 may be desirable, and in one embodiment, a single seed region 18 is formed. The seed regions 18 are the areas at which preferential graphene nucleation takes place. It is to be understood that the seed region 18 may include an additional seed material 20 (shown in FIGS. 2C, 2F and 4B) established or exposed therein, or the seed region 18 may include the substrate surface S as a seed material 20'.

The insulating layer 16 is generally formed of any material that is capable of insulating the graphene layer 12 from the substrate 14, and has a surface that is substantially resistant to graphene nucleation. The phrase "substantially resistant to graphene nucleation" means that the growth of graphene on the particular surface is not possible or is difficult when compared to nucleation of graphene on the seed material 20. Non-limiting examples of suitable materials include oxides (e.g., $SiO_2$), nitrides, or oxynitrides.

It is to be understood that the insulating layer 16 may also be selectively deposited using a mask such that the seed region(s) 18 are formed without additional patterning of the insulating layer 16. In still other instances, the insulating layer 16 may also be grown selectively using a previously patterned masking material that does not react to form an insulating material. A non-limiting example of such a process is the LOCOS process.

Once the seed region(s) 18 are formed, embodiments of the method include selectively establishing a seed material 20 in the seed region(s) 18. FIGS. 2C and 2F show different embodiments of the seed material 20 established in the seed regions 18. The seed material 20 is generally any material that that is capable of seeding graphene (i.e., allowing easier nucleation as compared to materials in other regions (e.g., the insulating layer 16)). Non-limiting examples of suitable seed materials 20 include Si (e.g., single-crystal Si), Fe, Au, Pt, Ni, or other like materials, or combinations/alloys thereof. In an embodiment, the seed region(s) 18 are filled with the seed material 20 by selective epitaxy. In another embodiment, the seed region(s) 18 expose a surface of a seed material 20 (described further hereinbelow in reference to FIGS. 4A-4D). As shown in FIG. 2C, the seed material 20 may be established such that a surface of the seed material 20 is substantially planar with a surface of the insulating layer 16. Alternately, as shown in FIG. 2F, the seed material 20 may be established such that a surface of the seed material 20 extends beyond a surface of the insulating layer 16. It is believed that the embodiment shown in FIG. 2F may, in some instances, provide enhanced control over the nucleation of the graphene. While not shown in the Figures, it is to be understood that the seed material 20 may also be established such that its surface is below a surface of the insulating layer 16.

In another embodiment of the method, the seed region(s) 18 do not have an additional seed material 20 established therein, and the exposed substrate surface S is the seed material 20' (as shown in FIG. 2I). In such an embodiment, the substrate surface S is formed of a material that is capable of seeding graphene.

FIGS. 2D and 2G depict, respectively, the embodiments of FIGS. 2C and 2F after exposure of the seed material 20 to a carbon-containing gaseous precursor under conditions that favor formation of the two-dimensional graphene structure. Such conditions may include using a desirable gas at a predetermined temperature and pressure. In one embodiment, the carbon-containing gaseous precursor is applied using a chemical vapor deposition (CVD) process. In a non-limiting example in which an Fe—Ni alloy is used as the seed material 20, 20', CVD is performed using ethylene ($C_2H_4$) gas at about 7500 Pa and at a growth temperature of about 700° C. The graphene 12' nucleates on the exposed seed material 20, rather than on the insulating layer 16. While some vertical growth occurs, the graphene 12' generally grows laterally from the seed material(s) 20 onto, and extending across, adjacent areas of the insulating layer 16. It is believed that such lateral growth is due, at least in part, to the relatively strong in-plane bonding compared to the relatively weak inter-planar bonding of the graphene structure.

As shown in FIGS. 2E and 2H, growth may be continued until the growing regions of graphene 12' from adjacent seed materials 20 impinge on each other (e.g., shown by the hidden lines) and form a continuous graphene layer 12. The crystal structure of the graphene layer 12 is the same or similar throughout, at least in part because all of the regions of graphene 12' are grown from similarly oriented seed materials 20. In some instances, discontinuities or defects, analogous to low-angle grain boundaries, may form where two growth fronts merge (e.g., at the hidden lines shown in FIGS. 2E and 2H). It is to be understood that the position where the growth fronts join is controllable, and can be avoided during device layout if these regions are likely to limit device performance. In other embodiments, the growth may be terminated before the growing regions of graphene 12' impinge on each other.

The embodiments of the method shown in FIGS. 3A through 3J avoid the formation of potential defects by incorporating a growth limiting feature 22 into embodiments of the structure 100, 100', 100" (shown in FIGS. 3E, 3G and 3J, respectively). One embodiment of the method is shown in FIGS. 3A through 3E, another embodiment of the method is shown in FIGS. 3A-3C, 3F, and 3G, and still another embodiment of the method is shown in FIGS. 3A-3C and 3H-3J.

Similar to FIGS. 2A and 2B, FIGS. 3A and 3B illustrate the substrate 14 having the insulating layer 16 established thereon, and the seed regions 18 formed in the insulating layer 16. FIG. 3C illustrates the seed material 20 established in the seed regions 18. It is to be understood that these embodiments may also utilize the exposed substrate S as the seed material 20', although not depicted in the FIG. 3 series. It is to be further understood that the processes and materials described above in reference to the FIG. 2 series are suitable for the methods described in the FIG. 3 series.

After the seed material 20 is established, a growth limiting feature 22, 22', 22" may be formed in the insulating layer 16, as shown in FIGS. 3D, 3F and 3H-3I. Each of the growth limiting features 22, 22', 22" dictates and/or limits the lateral growth of the graphene 12'/graphene layer 12 from the seed materials 20. The growth limiting features 22, 22', 22" generally stop the lateral growth of the graphene 12'. It is to be understood that the width of the growth limiting features 22, 22', 22" may be as large or small as is desirable. In an embodiment, the thickness of the growth limiting features 22, 22', 22" is less than the thickness of the insulating layer 16. In another embodiment, (shown in FIGS. 3K and 3L), the growth limiting feature 22''' is a raised ridge of the insulating layer 16. This growth limiting feature 22''' also dictates and/or limits the lateral growth of the graphene 12'/graphene layer 12 from the seed materials 20.

In FIG. 3D, the growth limiting feature 22 is formed by selectively etching (e.g., via reactive ion etching or wet etching) a predetermined distance into the thickness of the insulating layer 16. In this embodiment, at least some of the insulating layer 16 remains upon completion of the etching process such that the growth limiting feature 22 is a recess formed in the insulating layer 16. As shown in FIG. 3D, the growth limiting feature 22 may be formed directly adjacent one of two opposed sides of each seed material 20. Once the growth limiting feature(s) 22 are formed, the seed material(s) 20 may be exposed to the previously described carbon-containing gaseous precursor to initiate growth of the graphene 12' (as shown in FIG. 3E). In this non-limiting example, each growth limiting feature 22 limits the lateral growth of the graphene 12'. In one instance, the lateral growth is limited because the graphene 12' grows from the seed material 20 in a direction that is opposite to the feature 22 directly adjacent to the seed material 20. In another instance, the lateral growth is limited because the graphene 12' growth is terminated at the edge of the next growth limiting feature 22.

FIG. 3E illustrates the embodiment of the structure 100 including the embodiment of the growth limiting feature 22 shown in FIG. 3D. As depicted, each graphene layer 12 extends from one seed material 20 (having a growth limiting feature 22 directly adjacent thereto) to the next growth limiting feature 22, where growth is terminated.

In FIG. 3F, another embodiment of the growth limiting feature 22' is depicted. In this embodiment, the growth limiting feature 22' is formed between two adjacent seed materials 20, but is not directly adjacent to either of the seed materials 20. While the growth limiting feature 22' shown in FIG. 3F is substantially centered between two seed materials 20, it is to be understood that it may be formed at any desirable position between the two seed materials 20. The growth limiting feature 22' may be formed, for example, via the selective partial etching processes discussed in reference to FIG. 3D.

Once the growth limiting feature(s) 22' are formed, the seed material(s) 20 may be exposed to the previously described carbon-containing gaseous precursor to initiate growth of the graphene 12' (as shown in FIG. 3G). The growth limiting features 22' limit the lateral growth of the graphene 12'. In this embodiment, lateral growth begins at the seed material 20 and continues laterally in two dimensions. Growth continues until the growing graphene 12' encounters an edge of one of the growth limiting features 22'. Graphene growth 12' terminates at the edge, and the layer 12 is formed.

FIG. 3G illustrates the embodiment of the structure 100' including the embodiment of the growth limiting feature 22' shown in FIG. 3F. As depicted, each graphene layer 12 extends from one seed material 20 to two adjacent growth limiting features 22', where growth is terminated.

Referring now to FIGS. 3H through 3J, still another embodiment of the method includes completely etching through the insulating layer 16 to expose other areas 24 of the substrate surface S (see FIG. 3H), and then selectively establishing a material 26 to a predetermined thickness in the area 24 to form the growth limiting feature 22'' (see FIG. 3I). The etching of the insulating layer 16 completely or partially (see FIG. 5) through its thickness may be accomplished via the techniques previously described in reference to FIG. 3D. Furthermore, it is to be understood that the etching may be accomplished at any desirable position in the insulating layer 16 where it is desirable to form a growth limiting feature 22''.

Once the substrate surface S is exposed at areas 24, the material 26 is selectively deposited therein using, for example, CVD, PVD, electroplating, galvanic displacement, or other like methods. The material 26 is deposited to a desirable thickness that may be less than the thickness of the insulating layer 16. In an embodiment, the material 26 is the same material as the insulating layer 16, and in another embodiment, the material 26 is a different material than the insulating layer 16. It is believed that $SiO_2$ may be used for the material 26 when $Si_3N_4$ is used as the insulating layer 16. Furthermore, it is believed that $Al_2O_3$ may be used as one of the materials 16, 26 when $SiO_2$ or $Si_3N_4$ is used as the other material 26, 16. It is also to be understood that other combinations of materials may also be used for the material 26 and insulating layer 16. The deposited material 26 forms the growth limiting feature 22''.

As shown in FIGS. 3I and 3J, the growth limiting feature 22'' is formed directly adjacent to the seed material 20. As such, the growth of the graphene 12' in this non-limiting example is similar to the growth previously described in reference to FIGS. 3D and 3E. It is to be understood that the growth may be different if the growth limiting features 22'' are positioned differently (e.g., if positioned similar to the features 22' shown in FIG. 3G). Similar to the graphene growth described in reference to both FIGS. 3E and 3G, the graphene 12' of FIG. 3J grows from the seed material 20 until it reaches a growth limiting feature 22''.

FIG. 3J illustrates the embodiment of the structure 100'' including the embodiment of the growth limiting feature 22'' shown in FIG. 3I. As depicted, each graphene layer 12 extends from one seed material 20 to the next adjacent growth limiting features 22'', where growth is terminated.

It is to be understood that the other growth limiting features 22, 22' may also be formed via the method shown in FIGS. 3H and 3I rather than by partially etching through the thickness of the insulating layer 16. Furthermore, it is to be understood that other growth-limiting features (e.g., feature 22''') may be similarly used in place of etched recesses. A non-limiting example of another growth limiting feature 22''' is shown in FIG. 3K. This growth limiting feature 22''' is established on the surface of the insulating layer 16. The raised growth limiting features 22''' may be formed by selectively depositing additional material of the insulating layer 16 in a desirable position on the insulating layer 16, or by depositing the additional material over the entire surface and using lithography to define an etch-resistant mask over a portion of the surface, and then removing the material from the unprotected regions. This growth limiting feature 22''' is similar to the previously described features 22, 22', 22'' in that it limits the growth of the graphene 12'. FIG. 3L illustrates the embodiment of the structure 100''' including the embodiment of the growth limiting feature 22''' shown in FIG. 3K after graphene 12' is grown to form layers 12. As depicted, each graphene layer 12 extends from one seed material 20 to the next adjacent growth limiting features 22''', where growth is terminated.

FIGS. 4A through 4D depict still another embodiment of a method of forming another embodiment of the structure 1000. In this embodiment, as shown in FIG. 4A, a layer 21 of seed material 20 is established directly on the substrate surface S, and the insulating layer 16 is deposited or grown on the seed layer 21. The layer 21 of seed material 20 may be deposited or grown on the substrate surface S via physical vapor deposition (PVD), chemical vapor deposition (CVD), molecular-beam deposition, electroplating or electroless deposition, or by any other suitable technique.

As shown in FIG. 4B, the selective removal of the insulating layer 16 (using methods previously described hereinabove) exposes portions of the seed layer 21 surface and forms the seed regions 18. It is to be understood that in this embodiment, the seed material 20 surface that is exposed in the regions 18 will be used to seed growth of the graphene 12' (shown in FIG. 4C). The previously described methods may be used to initiate graphene 12' growth to form the layer 12 and structure 1000 shown in FIG. 4D. While not shown, growth limiting features 22, 22', 22", 22''' may also be incorporated into this embodiment of the method.

In the previously described embodiments, the seed region 18 includes (e.g., as a bottom surface of the region 18) a portion of the substrate surface S. It is to be understood, however, that the seed regions 18 may also extend partially through the insulating layer 16. Thus, such regions 18 do not include a portion of the substrate surface S. A non-limiting example of such a structure 10''' is shown in FIG. 5. As depicted, the insulating layer 16 is partially removed to form the seed regions 18, and as a result, the substrate surface S is not exposed at such regions 18. In one embodiment, the seed material 20 is then established in the regions 18 and the graphene layer 12 is grown as previously described. In another embodiment, the bottom of the etched region 18 may be used as the seed material 20. For example, ion bombardment may be used to create a surface texture in the region 18 that increases nucleation.

The embodiments disclosed herein are particularly suitable for growing across an area corresponding to one or more die. However, it is to be understood that if the area of growth is technically or economically limited to smaller sizes, growing a region that contains a few devices would also be practical for small circuits.

While several embodiments have been described in detail, it will be apparent to those skilled in the art that the disclosed embodiments may be modified. Therefore, the foregoing description is to be considered exemplary rather than limiting.

What is claimed is:

1. A method for forming a graphene layer, the method comprising:
    establishing an insulating layer on a substrate such that at least one seed region is formed therein, the insulating layer including a first surface that faces the substrate and a second surface opposed to the first surface that faces away from the substrate; and
    exposing a seed material in the at least one seed region to a carbon-containing precursor gas, thereby initiating nucleation of the graphene layer on the seed material and enabling lateral growth of the graphene layer along at least a portion of the second surface of the insulating layer.

2. The method as defined in claim 1, further comprising selectively establishing the seed material in the at least one seed region.

3. The method as defined in claim 2 wherein the seed material is selectively established to be planar with the second surface of the insulating layer or to extend beyond the second surface of the insulating layer.

4. The method as defined in claim 1 wherein the at least one seed region exposes a surface of the substrate and wherein the seed material is the exposed surface of the substrate.

5. The method as defined in claim 1 wherein establishing the insulating layer is accomplished by:
    depositing the insulating layer on a surface of the substrate; and
    patterning the insulating layer to form the at least one seed region.

6. The method as defined in claim 1 wherein establishing the insulating layer is accomplished by:
    i) thermally growing the insulating layer on a surface of the substrate; and
    patterning the insulating layer to form the at least one seed region; or
    ii) patterning a surface of the substrate with an oxidation resistant mask; and
    thermally growing the insulating layer on the patterned substrate surface.

7. The method as defined in claim 1 wherein prior to exposing the seed material to the precursor gas, the method further comprises forming a growth limiting feature in or on the insulating layer, the growth limiting feature configured to limit the lateral growth of the graphene layer.

8. The method as defined in claim 7 wherein the growth limiting feature is formed directly adjacent to or a spaced distance from one of two opposed sides of the seed material.

9. The method as defined in claim 8 wherein the lateral growth of the graphene layer initiates at the seed material and extends laterally in a direction dictated by the growth limiting feature.

10. The method as defined in claim 7 wherein forming the growth limiting feature is accomplished by at least one of 1) etching a recess in the insulating layer such that a predetermined thickness of the insulating layer remains, 2) etching a recess in the insulating layer to expose a portion of a surface of the substrate and establishing a material to a predetermined thickness on the exposed portion, or 3) establishing an additional region of a same or different insulating material on the insulating layer.

11. The method as defined in claim 1 wherein establishing the insulating layer on the substrate such that the at least one seed region is formed is accomplished by:
    establishing a layer of the seed material on a surface of the substrate;
    depositing the insulating layer on the seed material layer; and
    patterning the insulating layer to expose the seed material and form the at least one seed region.

12. A structure, comprising:
    a substrate;
    an insulating layer established on the substrate, the insulating layer including:
        at least one seed region formed therein; a first surface facing the substrate; and a second surface opposed to the first surface and facing away from the substrate;
    a seed material located at the at least one seed region; and
    a graphene layer extending from the seed material laterally along at least a portion of the second surface of the insulating layer.

13. The structure as defined in claim 12 wherein the insulating layer is selected from a material that insulates the graphene layer from the substrate and is substantially resistant to graphene nucleation.

14. The structure as defined in claim 12 wherein the seed material is a material that allows graphene nucleation.

15. The structure as defined in claim 12 wherein the seed material is i) an exposed surface of the substrate at the seed region, ii) an exposed surface of a seed material layer at the seed region, or iii) a material established in the seed region.

16. The structure as defined in claim 12 wherein a surface of the seed material is substantially planar with the second surface of the insulating layer or extends beyond the second surface of the insulating layer.

17. The structure as defined in claim 12 wherein the at least one seed region has two opposed sides, and wherein the structure further comprises a growth limiting feature formed in or on the insulating layer directly adjacent to or a spaced distance from one of the two opposed sides of the at least one seed region.

18. The structure as defined in claim 12 wherein the first surface of the insulating layer directly contacts the substrate.

19. The structure as defined in claim 12 wherein the seed material is in the form of a seed material layer positioned between the substrate and the first surface of the insulating layer.

20. A structure, comprising:
a substrate;
an insulating layer established on the substrate, the insulating layer including at least one seed region formed therein, the at least one seed region having two opposed sides;
a seed material located at the at least one seed region; and
a graphene layer extending from the seed material laterally along at least a portion of a surface of the insulating layer;
a growth limiting feature formed in or on the insulating layer directly adjacent to or a spaced distance from one of the two opposed sides of the at least one seed region;
wherein the growth limiting feature includes a recess in the insulating layer, and wherein the recess renders the graphene layer non-contiguous.

21. The structure as defined in claim 20 wherein the recess extends through a portion of a thickness of the insulating layer.

* * * * *

UNITED STATES PATENT AND TRADEMARK OFFICE
CERTIFICATE OF CORRECTION

| | | |
|---|---|---|
| PATENT NO. | : 8,043,687 B2 | Page 1 of 1 |
| APPLICATION NO. | : 12/253158 | |
| DATED | : October 25, 2011 | |
| INVENTOR(S) | : Theodore I. Kamins et al. | |

It is certified that error appears in the above-identified patent and that said Letters Patent is hereby corrected as shown below:

In column 9, line 16 (approx.), in Claim 20, delete "including" and insert -- including: --, therefor.

Signed and Sealed this
Tenth Day of July, 2012

David J. Kappos
*Director of the United States Patent and Trademark Office*